(12) United States Patent
Panis et al.

(10) Patent No.: US 7,337,377 B2
(45) Date of Patent: Feb. 26, 2008

(54) ENHANCED LOOPBACK TESTING OF SERIAL DEVICES

(75) Inventors: Michael C. Panis, Brookline, MA (US); Bradford B. Robbins, Wellesley, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/315,974

(22) Filed: Dec. 22, 2005

(65) Prior Publication Data

US 2006/0123304 A1     Jun. 8, 2006

Related U.S. Application Data

(63) Continuation of application No. 09/751,633, filed on Dec. 29, 2000, now Pat. No. 7,017,087.

(51) Int. Cl.
*G01R 31/28* (2006.01)

(52) U.S. Cl. ..................................... 714/716

(58) Field of Classification Search ................ 714/717

See application file for complete search history.

(56) References Cited

OTHER PUBLICATIONS

Hordeski 'Microcomputer LANs,' 2nd Ed., 1991, pp. 34-35 and 224-233.*

* cited by examiner

*Primary Examiner*—Guy J. Lamarre
(74) *Attorney, Agent, or Firm*—Jill C. Shedd

(57) ABSTRACT

A system and method for economically yet thoroughly testing serial ports of electronic devices includes a receiver and a transmitter. The receiver is coupled to a TX line of a device under test for receiving an input serial bit stream from the device under test. The transmitter is coupled to a RX line of the device under test for providing an output serial bit stream to the device under test. The receiver is coupled to the transmitter for establishing a loopback connection. A time distortion circuit is interposed between the receiver and the transmitter, for adding predetermined amounts of timing distortion to the output serial bit stream. In addition, a selector is interposed between the receiver and the transmitter, for selecting between the receiver and a direct input. The direct input provides an algorithmic test signal that differs from the input serial bit stream received by the receiver. The direct input thus allows a tester to exercise the device under test with a test signal that differs from the signal that the device under test generates. A time measurement circuit measures timing characteristics of the device under test, and a parametric measurement circuit measures steady-state characteristics of the device under test.

7 Claims, 3 Drawing Sheets

ENHANCED LOOPBACK TESTING OF SERIAL DEVICES

CROSS REFERENCE TO RELATED APPLICATIONS

This application is a continuation of application Ser. No. 09/751,633 filed on Dec. 29, 2000 now U.S. Pat. No. 7,017,087.

This invention relates generally to automatic test equipment for electronics, and, more particularly, to the automatic testing of electronic devices that include serial communication ports.

BACKGROUND OF THE INVENTION

As electronic devices grow in complexity, greater numbers of leads are required for forming connections between different devices. Consequently, the layout and design of circuit boards has become increasingly complex. Serial communication ports offer a partial remedy to this complexity, as they allow devices to communicate using far fewer lines than parallel devices. Serial ports communicate via only two lines—one for transmitting data and one for receiving data. These lines can be single-ended (i.e., one signal referenced to ground) or differential (i.e., two complementary signals, neither of which is ground). To transfer data at rates comparable to parallel ports, serial ports tend to operate at much higher speeds than parallel ports. Modern serial ports operate at data rates up to several gigahertz (GHz).

Serial ports place particular demands on automatic test equipment ("ATE"). For example, serial ports can generally transmit and receive data simultaneously. To thoroughly test serial ports, the tester itself should be able to both transmit and receive data simultaneously. Serial ports can also transmit and receive data at different rates, meaning that the tester should operate at different rates. Perhaps most significantly, serial ports tend to operate at extremely high speeds, which are much faster than the pin electronics operate in conventional testers.

Broadly speaking, techniques for testing serial ports fall into three categories: fully functional digital testing, algorithmic testing, and loopback testing. Fully functional digital testing employs complex, pattern-based instruments for generating serial stimuli and for monitoring serial responses. These instruments typically operate at high speeds, sufficiently fast for testing most serial ports, and provide a great deal of control over the timing of signals and their amplitudes. Although they are flexible and capable, fully functional digital instruments tend to be costly and require long development times. Examples of fully functional digital test instruments include the Gazelle™ and Super Speed Serial Pin™, both from Teradyne, Inc., of Boston, Mass.

Algorithmic testing tends to be less expensive than fully functional digital testing. Algorithmic testing involves generating serial bit streams according to any of a number of predetermined algorithms, and monitoring serial responses to ensure that they match expected responses to the serial stimuli. Stimuli can be arranged according to a wide variety of algorithmic patterns, for example, pseudo-random patterns, march patterns (walking a "1" through a field of "0's"), alternating bit patterns, and many others. Although algorithmic testing is less expensive than fully functional testing, it is also less thorough. For example, algorithmic testing is generally not able to control the placement of individual edges transmitted to a serial port. Because it uses a limited set of patterns, algorithmic testing also cannot test the particular circuitry of individual devices.

Loopback testing is the simplest and perhaps the most popular way to test serial ports. Loopback testing involves connecting the transmit line (TX) of a serial port back to its own receive line (RX). The device is then made to transmit a known pattern of serial data. Once the data is transmitted, the tester monitors lower-speed pins of the device, which have states that depend upon the correct operation of the TX and RX lines, to determine whether the test passes or fails.

Loopback testing is extremely convenient. The test fixture for a serial port merely requires a wire for connecting the transmit line to the receive line. The tester neither transmits serial data nor receives serial data. We have recognized, however, that this convenience comes at the cost of thoroughness. Because the serial port receives data at the same rate at which it transmits data, loopback testing does not separately test that the transmit line of a serial port can operate at a different speed from the receive line. The tester can thus fail to detect internal defects in a device's synchronizing circuitry. We have also recognized that, because the tester does not directly create the serial bit stream, the tester cannot test the tolerance of a serial port to imperfect input signals. These include input signals having amplitude errors, distortion, and timing jitter. Neither can the tester directly measure the serial port's output signals, to ensure that they have correct amplitudes and timing characteristics.

Still, the convenience of loopback testing offers significant promise for achieving low-cost testing of serial ports. What is needed, however, is a way of enhancing the flexibility and test coverage of loopback testing, without significantly increasing its cost.

SUMMARY OF THE INVENTION

With the foregoing background in mind, it is an object of the invention to test serial ports thoroughly and at relatively low cost.

To achieve the foregoing object, as well as other objectives and advantages, an enhanced loopback technique is employed for testing serial ports. The technique includes a receiver and a transmitter each having an input and an output. The receiver receives a test signal at its input from the TX line of a serial port. The transmitter provides a test signal from its output to the RX line of the serial port. The output of the receiver is coupled to the input of the transmitter for establishing a loopback connection.

According to one variation, the input of the receiver is coupled to a parametric measurement circuit, for evaluating steady-state characteristics of the TX line of the serial port. The output of the transmitter may also be coupled to the parametric measurement circuit, for evaluating steady-state characteristics of the RX line of the serial port.

According to another variation, the output of the receiver is coupled to a time measurement circuit for measuring timing characteristics of the test signal generated at the TX line of the serial port.

According to yet another variation, a time distortion circuit is interposed between the output of the receiver and the input of the transmitter for providing predetermined timing distortions to the test signal before it is provided to the RX line of the serial port.

According to still another variation, a selector is interposed between the output of the receiver and the input of the transmitter, for selecting between the output of the receiver and a direct input, wherein the direct input provides a predetermined serial bit stream that is different from the test signal received by the receiver.

BRIEF DESCRIPTION OF THE DRAWINGS

Additional objects, advantages, and novel features of the invention will become apparent from a consideration of the ensuing description and drawings, in which—

DETAILED DESCRIPTION OF THE PREFERRED EMBODIMENT

Conventional Tester Architecture

Figure 1:
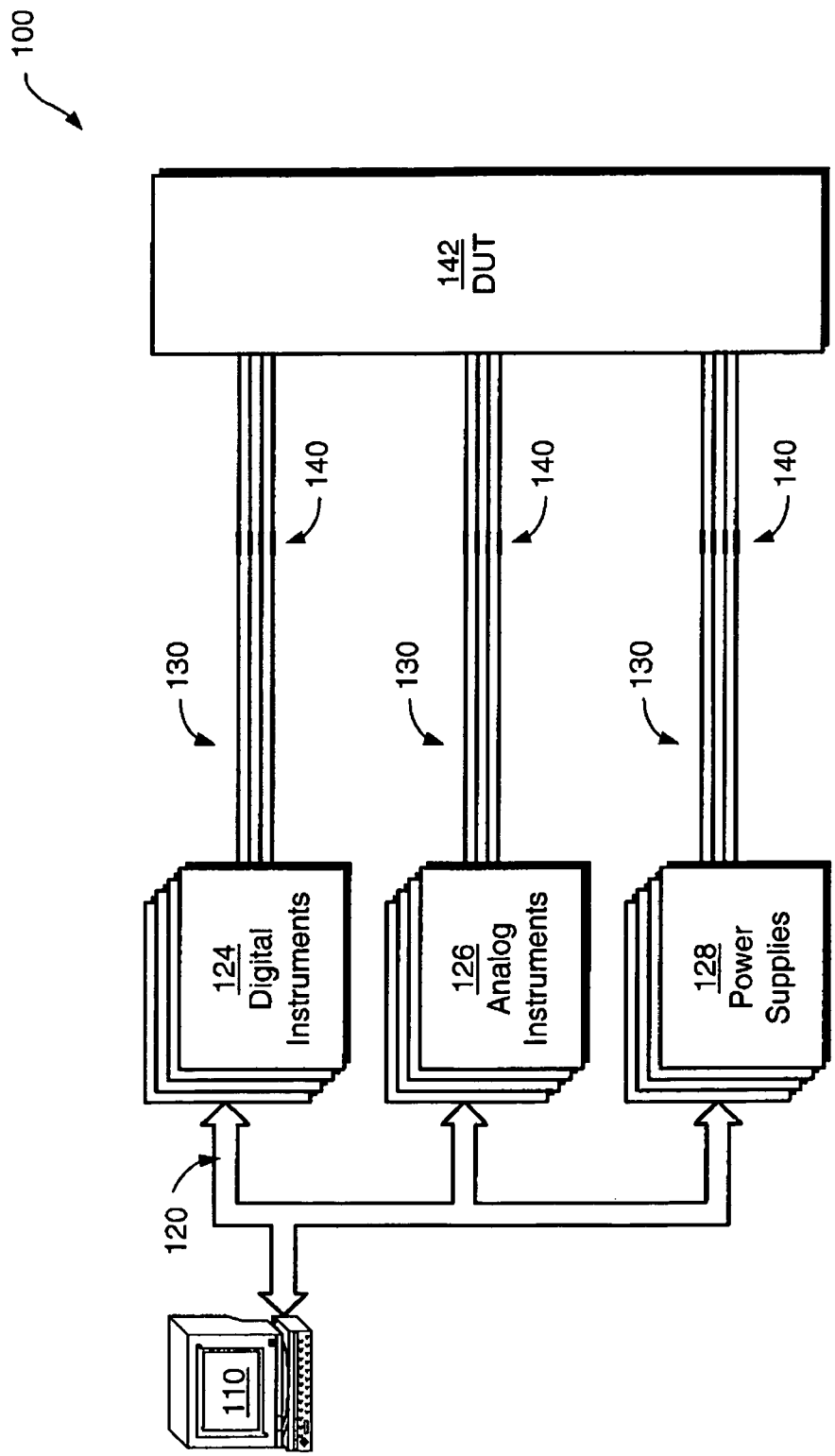
FIG. 1 shows a conventional tester architecture according to the prior art.

FIG. 1 is a highly simplified illustration of a conventional architecture 100 for an automatic test system, or "tester," in which the instant invention can be used. A host computer 110 runs a program for testing a device under test ("DUT") 142 using a variety of electronic hardware. This hardware generally includes digital instruments 124, analog instruments 126, and power supplies 128.

The electronic hardware is connected to the DUT 142 via a plurality of lines 130 and respective contacts 140. The contacts 140 generally consist of spring-loaded pins that extend from the tester. The pins can be either single-ended or coaxial. The DUT is placed on a device interface board, or "DIB." The DIB generally includes conductive pads arranged in patterns that match the patterns of spring-loaded pins extending from the tester. The pins make contact with the pads to form connections between the tester and the DUT 142.

The digital instruments 124 typically include, for example, clock generators, serial testing instruments, and parallel testing instruments. The analog instruments 126 typically include, for example, one or more parametric measurement units, for measuring DC characteristics of circuit nodes, and one or more timer/counters, for measuring timing characteristics of circuit nodes. They may also include a variety of other instruments for generating and analyzing waveforms for testing the DUT 142. Via a control bus 120, the host computer 110 communicates with and controls the electronic hardware for testing the DUT 142 in accordance with instructions in the test program.

Topology and Operation

Figure 2:
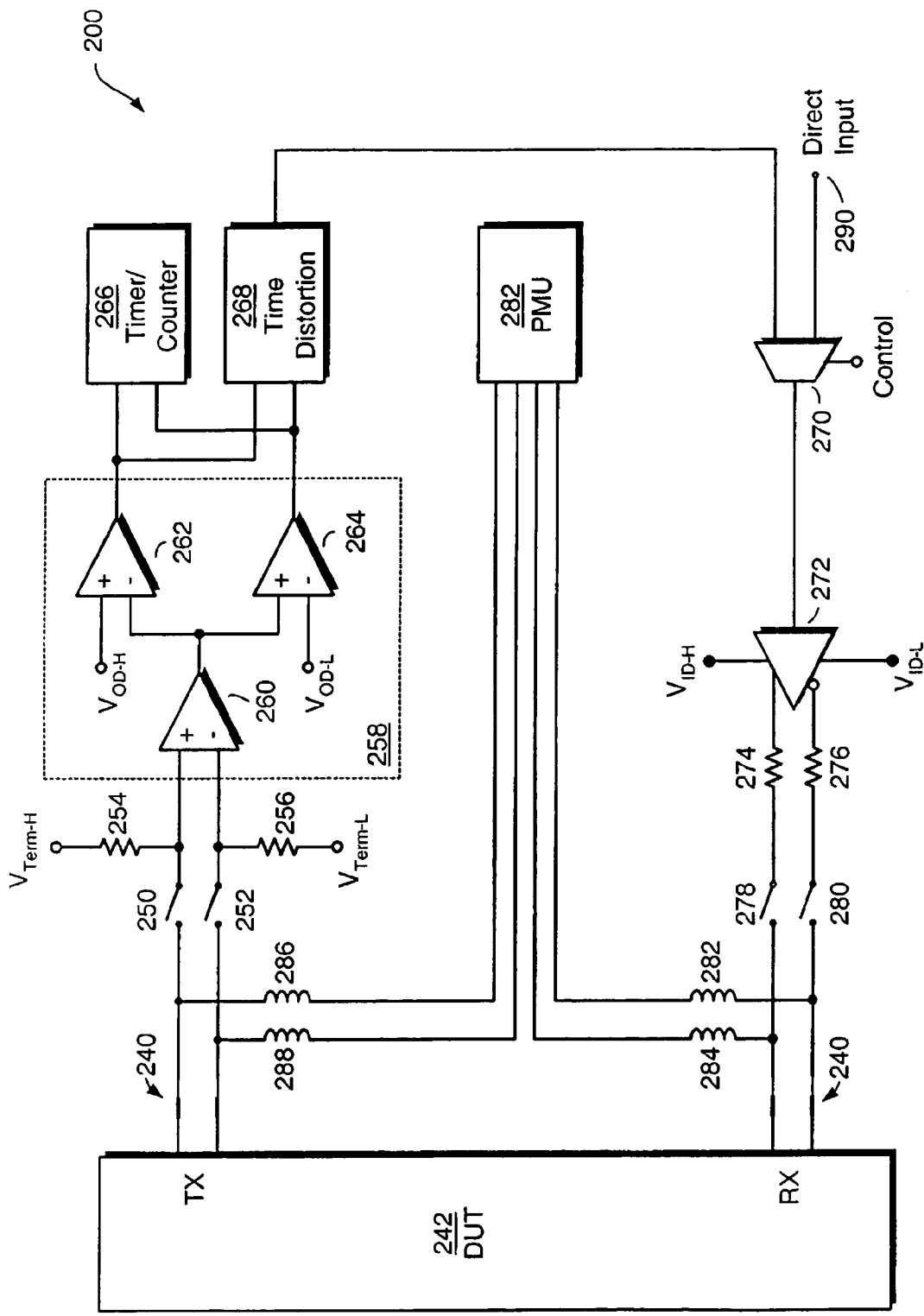
FIG. 2 shows an enhanced loopback device for testing serial communications ports in accordance with the invention.

FIG. 2 illustrates instrumentation 200, according to the invention, for performing enhanced loopback testing of serial ports. The instrumentation 200 is preferably implemented as a digital instrument, and is housed within the tester 100 along with other digital instruments 124.

As shown in FIG. 2, the instrumentation 200 includes a receiver 258. The receiver 258 is arranged to be coupled to a TX line of a DUT 242 via contacts 240.

The instrumentation 200 also includes a transmitter 272. The transmitter 272 is arranged to be coupled to a RX line of the DUT 242 via additional contacts 240. As described in more detail below, the output of the receiver 258 can be coupled to the input of the transmitter 272 to provide loopback testing of the DUT 242.

In the preferred embodiment, the receiver 258 includes a differential amplifier 260 constructed for receiving a differential signal from the DUT 242. The differential amplifier converts the differential inputs from the TX line into a single-ended signal. Comparators 262 and 264 compare the single-ended signal with programmable threshold voltages, $V_{OD-H}$ and $V_{OD-L}$, respectively, to determine whether the single-ended signal exceeds the thresholds. Resistors 254 and 256 (typically 50-ohms) terminate the inputs of the differential amplifier 260 to respective termination voltages, $V_{TERM-H}$ and $V_{TERM-L}$. The termination voltages are preferably programmable.

The combination of the differential amplifier 260 with the comparators 262 and 264 yields a differential comparator, i.e., a comparator that switches in response to the differential input voltage at TX crossing one or more predetermined thresholds. By providing two comparators 262 and 264, the instrumentation 200 can produce an edge whenever the differential input signal (at TX) crosses either of the two thresholds. This feature can be used, for example, for verifying a device's risetime and falltime specifications, which is generally not possible using conventional loopback testing. It can also be used for verifying that the device's output levels meet specifications, which also is generally not possible using conventional loopback testing. Alternatively, only one comparator can be used, with correspondingly less functionality.

As yet another alternative, an additional set of comparators can be provided to examine the common-mode component of the signal from the TX line, to ensure that it meets the specifications of the DUT. These comparators can also be used for detecting intentionally-imposed common-mode signals, often known as "speed signaling" signals. In addition, yet another set of comparators can be provided for examining each side of the differential signal from the TX line individually, to ensure that each side separately meets the specifications of the DUT.

In the preferred embodiment, the transmitter 272 is a differential driver that provides complementary output signals that vary between high and low voltage levels. These high and low levels, respectively labeled $V_{ID-H}$ and $V_{ID-L}$, are programmable for testing the tolerance of the RX line to input signals with different voltage levels. Resistors 274 and 276 terminate the signals generated by the transmitter 272.

Conventional loopback testing suffers from an inability to measure jitter in the TX line of a serial port. To overcome this limitation, the output of the differential comparator is coupled to a time measurement circuit, such as a timer/counter 266. The timer/counter 266 can measure the jitter of the TX line. It can also independently measure its frequency and other characteristics.

The output of the differential comparator is also coupled to a time distortion circuit 268. In response to specified factors, the time distortion circuit 268 selectively introduces timing distortions into the signal from the TX line before it is looped back to the RX line. In one mode, the time distortion circuit 268 has the effect of introducing jitter into the RX line. By adding jitter to the RX line and monitoring the device's response (i.e., whether it properly receives data provided by the TX line), the tolerance of the RX line to jitter can be independently tested.

According to the preferred embodiment, the time distortion circuit 268 comprises a selector, a slew-rate limited circuit, and a high-speed comparator. The selector selects the output of one of the comparators 262 and 264 for input to the slew-rate limited circuit, and the slew-rate limited circuit converts an edge at the selected input into a ramp. The ramp is fed to a first input of the high-speed comparator, and a threshold signal is fed to a second input. To introduce jitter, a specified amount of voltage noise is superimposed on the threshold signal. The comparator converts the voltage noise into timing noise, or jitter.

Other types of time distortions are possible. For example, by changing the DC value of the threshold voltage, the input signal from the selected comparator output can be phase-shifted. By superimposing a periodic waveform, the input signal can be phase modulated. By providing a stable threshold voltage, the input signal passes substantially undistorted.

The instrumentation 200 also includes a selector 270. The selector 270 operates under control of the host computer 110. It passes to its output either the output of the time distortion circuit 268 or a signal from a direct input 290. If the selector passes the output of the time distortion circuit 268, then a loopback configuration is established. However, if it passes the signal from the direct input 290, the loopback connection is broken, and the transmitter 272 is driven by the direct input signal.

The direct input 290 conveys a serial bit stream that is different from the bit stream produced by the TX line of the DUT 242. The direct input 290 contains different data from that transmitted by the TX line, and may operate at a different bit rate from the TX line. In the preferred embodiment, the direct input 290 provides a simple algorithmic pattern of 1's and 0's, e.g., a pseudo-random pattern or an alternating "1010" pattern, which can be generated at a variable clock rate. By providing different data from that generated by the TX line at different speed, the direct input 290 fills a significant gap in the coverage of loopback testing—it allows the RX line of a serial port to be tested separately from the TX line.

The instrumentation 200 of FIG. 2 also includes a parametric measurement circuit, such as the parametric measurement unit (PMU) 282. The PMU 282 is coupled to the TX and RX lines of the DUT 242, for performing parametric testing of those lines. As known to those skilled in the art, PMU's contain circuitry for forcing voltages, forcing currents, measuring voltages, and measuring currents. They are used for testing steady-state characteristics of devices, such as leakage currents, impedances, output currents, and compliance voltages. Providing a PMU incorporates these functions into the instrumentation 200, and further enhances testing capabilities.

The instrumentation 200 preferably includes switches, such as relays 250, 252, 278, and 280. To perform parametric testing, the relays are opened, and the PMU exercises the TX and RX lines. Because the instrumentation 200 is decoupled from the DUT 242, loading effects from the instrumentation 200 are eliminated.

To perform serial testing, the relays 250, 252, 278, and 280 are closed. In the preferred embodiment, the PMU 282 is coupled to the RX and TX lines via inductors 282, 284, 286, and 288. The inductors avoid the need for providing separate switches for connecting and disconnecting the PMU. The inductors behave like open circuits to high speed serial bit streams and like short circuits to DC parametric signals.

Except for the PMU 282 and the associated inductors, the instrumentation 200 is preferably composed of high-speed electronic devices connected with high-speed signal paths. The circuitry may be implemented using one or more Application-Specific Integrated Circuit (ASIC), with high-speed discrete components, or with a combination of these. Because the instrumentation is directed at use in an ATE system that already includes test instruments, resources need not be duplicated in the instrumentation 200 if they are already found elsewhere in the test system. For example, testers manufactured by Teradyne, Inc. generally include a separate timer/counter and a separate PMU. They also include clock generators and other parallel digital instruments, which can be used to create a signal source for the direct input 290. These instruments can be used in conjunction with the instrumentation 200 to avoid the costs that would otherwise be incurred by duplicating them within the instrumentation 200.

Testing Methods

Figure 3:
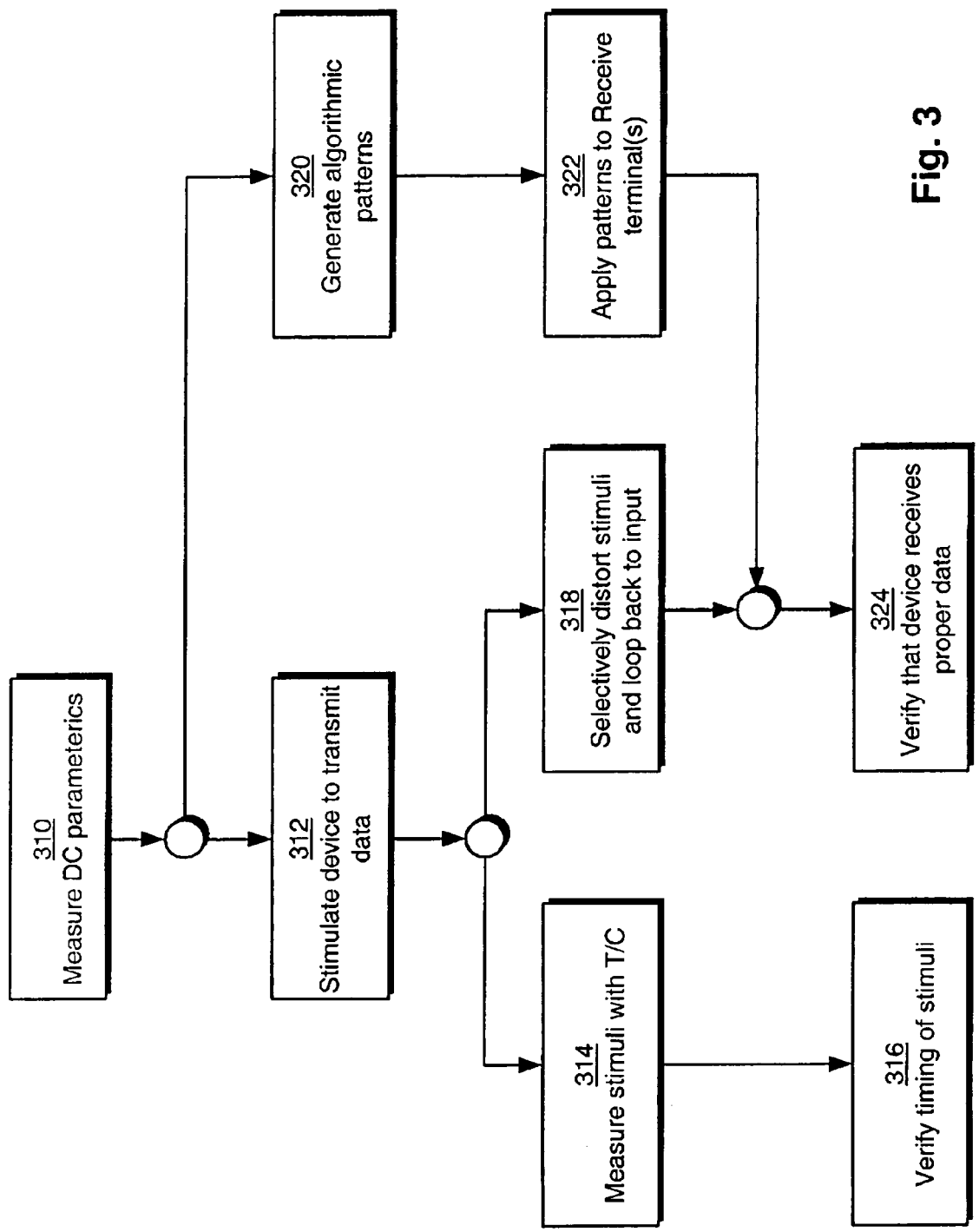
FIG. 3 illustrates a flowchart for testing serial communications ports using the device shown in FIG. 2.

FIG. 3 is a flowchart that illustrates testing procedures that can be performed on serial ports with the instrumentation 200. As the figure indicates, various tests can be performed, and the order of their performance is not critical.

At step 310, the host computer 110 directs the instrumentation 200 to measure DC parametrics. This step entails opening the relays 250, 252, 278, and 280 and testing the TX and RX lines through the inductors 282, 284, 286, and 288, with the remainder of the instrumentation 200 disconnected. At the conclusion of parametric testing (or at minimum before serial testing begins), the relays 250, 252, 278, and 280 are closed.

At step 312, the host computer 110 stimulates the DUT 242 to transmit serial data. As a consequence, the DUT 242 generates a serial bit stream on its TX line. The serial bit stream propagates to the differential amplifier 260, and then to the comparators 262 and 264. At step 314, the timer/counter 266 measures the signals produced by the comparators 262 and 264. As indicated above, measurements may include jitter, frequency, or other characteristics of the signal on the TX line.

At step 316, the host computer 110 reads the measurement results of the timer/counter 266, to determine whether the measured characteristics are within specified limits.

Rather than—or in addition to—measuring characteristics of the TX line with the timer/counter 266, enhanced loopback testing can be performed. At step 318, a signal from one of the comparators 262 and 264 is fed to the time distortion circuitry 268. In accordance with specified factors, the signal is predictably distorted and fed back to the RX line, via the transmitter 272. At step 324, the host computer 110 polls the DUT 242 to ascertain whether the serial bit stream received on the RX line matches the serial bit stream transmitted on the TX line. The test passes or fails depending upon the response.

In addition, the threshold levels of the comparators 262 and 264 can be programmed to the limits of the DUT's amplitude specification for the TX line. The DUT is monitored as before. A valid signal only propagates to the RX line—and the DUT only passes—if the DUT meets its amplitude specifications for the TX line.

Analogously, the output levels of the transmitter 272 can be programmed to the limits of the DUT's amplitude specifications for the RX line. The DUT is monitored, and the DUT only passes if the DUT meets its amplitude specifications for the RX line.

Rather than, or in addition to, relying upon the DUT 242 to provide stimuli, separate stimuli can be provided via the direct input 290. At step 320, the host computer 110 controls the selector 270 to block the loopback signal, and instead to pass a signal from the direct input 290. An algorithmic pattern is generated. At step 322, the algorithmic pattern is applied to the RX line of the DUT. At step 324, the host computer 110 polls the DUT 242 to verify that the DUT receives proper data.

The enhanced loopback techniques described above are inexpensive and flexible. Resources such as the timer/counter and PMU are already included in most test systems, so their functions can be incorporated by the enhanced loopback instrumentation at little or no additional cost. TX and RX lines of a serial port can be independently tested for amplitude errors and jitter. Using the direct input 290, algorithmic patterns can be applied for testing the RX line with different data from the TX line, and at different frequencies, thus providing truly independent testing of the RX and TX lines.

Alternatives

Having described one embodiment, numerous alternative embodiments or variations can be made.

As described above, the timer/counter and PMU are remote instruments. However, they can also be provided locally. At somewhat increased cost, the timer/counter and PMU can be integrated within the instrumentation 200 to provide a more self-contained instrument.

The enhanced loopback instrumentation 200 has been described above as being housed within one or more instruments of a tester. However, its location may vary. Alternatively, the instrumentation can be placed on the device interface board next to the DUT, or can be split between these locations. According to yet another alternative, the instrumentation 200 may be provided within a stand-alone instrument, which communicates with the host computer 110 via a separate bus, for example, an IEEE-488 bus or a VXI bus.

A single, enhanced loopback circuit 200 has been described above. Alternatively, multiple circuits 200 can be included together, for testing multiple serial ports. The timer/counter and PMU can be switched between the different circuits, or multiple timer/counters and PMU's can be provided.

The instrumentation 200 described above allows for a wide range of testing. For example, the output of the differential comparator can also be coupled to data capture instruments (not shown) or parallel digital instruments. These instruments can process signals from the differential comparator for additional testing, for example, to extract data encoded in serial bit streams generated by the DUT 242. The extracted data can then, for example, be used to initialize the DUT, via the direct input, for subsequent testing.

As described above, the PMU 282 is connected to the TX and RX lines via inductors. Relays or other switches could also be used, provided that they adequately block high-frequency serial bit streams.

The example described above employs a differential receiver and a differential transmitter for communicating with differential RX and TX lines of a device under test. This is not required, however. For testing single-ended serial ports, a single-ended receiver and a single-ended transmitter could be used. Alternatively, the differential receiver and transmitter described above could be used, with one input of the receiver held to a constant voltage and one output of the transmitter left open.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

What is claimed is:

1. A method of testing a serial port of a device under test in an automatic test system comprising:
   (A) evaluating steady-state characteristics of at least one of an actual physical transmit line and an actual physical receive line of the serial port in a production environment;
   (B) configuring the device under test to generate a serial bit stream and converting said serial bit stream to a direct physical test signal;
   (C) measuring at least one timing characteristic of the direct physical test signal received with a time measurement circuit;
   (D) receiving the serial bit stream directly, without benefit of a third or intermediary node, from the transmit line of the serial port of the device under test;
   (E) transmitting one of the received serial bit stream and a direct input over a physical line directly to the physical receive line of the serial port of the device under test; wherein transmitting includes programming the levels of the transmitted signal to determine whether the device under test responds to input at the programmed levels; and
   (F) directly monitoring the device under test to determine whether the serial bit stream received by the device under test matches an expected serial bit stream.

2. A method as recited in claim 1, further comprising introducing predetermined timing distortions into the test signal received in step D, prior to transmitting the test signal to the device under test in step E.

3. A method as recited in claim 2, wherein the predetermined timing distortions include jitter.

4. A method as recited in claim 1, wherein the serial bit stream is received in step D by a comparator having at least one input threshold, and the method further comprises programming the at least one threshold to test whether the device under test produces valid output levels.

5. A method as recited in claim 1, wherein the direct input comprises algorithmic input that is different from the serial bit stream received in step D.

6. A method as recited in claim 5, wherein the algorithmic input comprises at least one of a pseudo-random sequence of 1's and 0's and an alternating sequence of 1's and 0's.

7. A method as recited in claim 1, wherein the direct input conveys a serial bit stream having a frequency that differs from the frequency of the serial bit stream of the transmit line.

* * * * *